United States Patent [19]

Lytle

[11] Patent Number: 4,787,958

[45] Date of Patent: Nov. 29, 1988

[54] METHOD OF CHEMICALLY ETCHING TIW AND/OR TIWN

[75] Inventor: William H. Lytle, Chandler, Ariz.

[73] Assignee: Motorola Inc., Schaumburg, Ill.

[21] Appl. No.: 90,823

[22] Filed: Aug. 28, 1987

[51] Int. Cl.⁴ .................... H01L 21/28; H01L 21/308
[52] U.S. Cl. .................................. 156/652; 156/656; 156/664; 437/183; 437/192; 437/246
[58] Field of Search ............... 156/652, 656, 664, 634; 252/79.1, 79.5; 437/183, 190, 192, 246, 245

[56] References Cited

U.S. PATENT DOCUMENTS

| | | | |
|---|---|---|---|
| 3,992,235 | 11/1976 | Garbarini | 156/656 |
| 4,267,012 | 5/1981 | Pierce et al. | 156/664 X |
| 4,381,215 | 4/1983 | Reynolds et al. | 156/664 X |
| 4,443,295 | 4/1984 | Radigan et al. | 156/664 X |
| 4,491,860 | 1/1985 | Lim | 357/68 |
| 4,597,003 | 6/1986 | Aine et al. | 156/652 X |
| 4,668,335 | 5/1987 | Mockler et al. | 156/652 X |
| 4,711,701 | 12/1987 | McLevite | 437/245 X |

*Primary Examiner*—David L. Lacey
*Assistant Examiner*—Andrew J. Anderson
*Attorney, Agent, or Firm*—Joe E. Barbee; Raymond J. Warren

[57] ABSTRACT

A method of chemically etching TiW and/or TiWN is described wherein the etching of a semiconductor substrate having a layers of TiWN, TiW and Au disposed between the substrate and a Au bump is performed with a 30% solution of hydrogen peroxide ($H_2O_2$) at a temperature of approximately 90° C.

5 Claims, 1 Drawing Sheet

METHOD OF CHEMICALLY ETCHING TIW AND/OR TIWN

BACKGROUND OF THE INVENTION

The present invention relates, in general, to chemical etching and, more particularly, to chemical etching of titanium-tungsten (TiW) and/or titanium-tungsten-nitride.

Many methods of chemical etching are known in the art. Generally, a solution of EDTA (ethylenediaminetraacetic acid), hydrogen peroxide ($H_2O_2$), and ammonium hydroxide ($NH_4OH$) is used in the etching of titanium-tungsten. However, two problems exist with the use of this mixture as an etchant: undercutting; and differing etch rates for the TiW and TiWN. Undercutting is a problem encountered at the interface of two chemically different metals. In tape automated bonding (TAB), layers of TiW and TiWN are often used to physically coupled a gold bump to the substrate. During the etching of the TiW and TiWN, a galvanic effect causes the etchant to undercut the gold bump. This is enhanced by the presence of $NH_4OH$, an electrolyte. This conductive property of $NH_4OH$ enhances the galvanic effect and increases the undercut rate of the etchant. Under normal etching conditions, it has been found that the etchant will completely undercut the gold bump before completing the etch of the TiWN layer.

The second problem is that the etch rates of TiW and TiWN differ with TiW etching faster. This contributes to the overall problem of undercut during etching.

Accordingly, it is an object of the present invention to provide a method of chemically etching TiW and/or TiWN that overcomes the above deficiencies and problems.

A further object of the present invention is to provide a method of chemically etching TiW and/or TiWN that will reduce undercut.

Another object of the present invention is to provide a method of chemically etching TiW and/or TiWN that will provide a more uniform etch.

The above and other objects and advantages of the present invention are provided by the method of chemically etching TiW and/or TiWN described herein.

SUMMARY OF THE INVENTION

A particular embodiment of the present invention comprises etching a semiconductor substrate having a layers of TiWN, TiW and Au disposed between the substrate and a Au bump. After the gold layer has been removed, the TiW and TiWN are etched using approximately a 30% solution of hydrogen peroxide ($H_2O_2$) at a temperature of approximately 90° C.

DETAILED DESCRIPTION OF THE DRAWINGS

Figure 1:
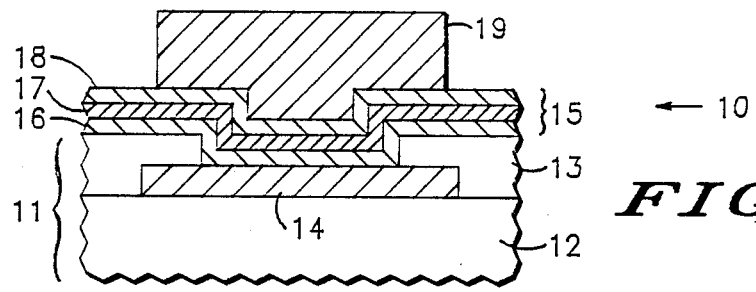
FIGS. 1–3 are process flow diagrams of a method embodying the present invention.
Figure 2:
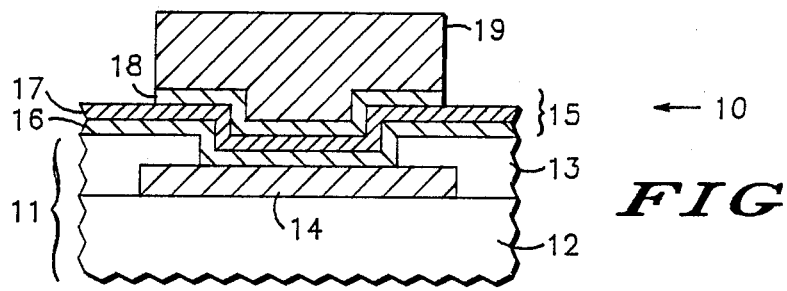
Figure 3:
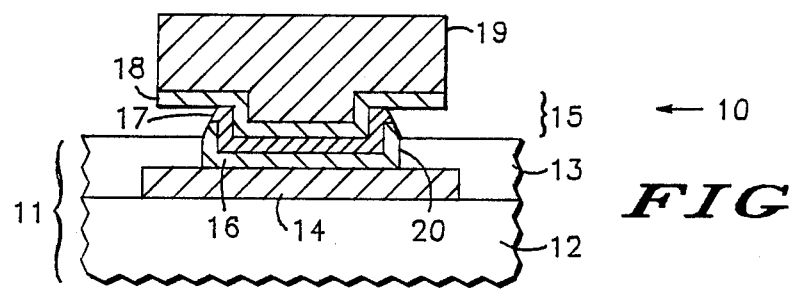

Referring now to FIGS. 1–3, process flow diagrams of a method embodying the present invention are illustrated. As shown in FIG. 1, the process is commenced with a semiconductor device, generally designated 10. Device 10 consists of a substrate 11 being comprised in this particular embodiment of a silicon layer 12, a polyimide 13, and an aluminum layer 14. It should be noted here that the substrate can be of any material and that the above are shown as one preferred embodiment.

Disposed on the surface of substrate 11 is an adhesion/barrier layer 15. Layer 15 is composed: of a layer of titanium-tungsten-nitride (TiWN) 16; a layer of titanium-tungsten (TiW) 17; and a layer of gold (Au) 18. Titanium-tungsten-nitride layer 16 acts as a diffusion barrier between aluminum 14 and gold 18. Titanium-tungsten-nitride layer 16 is deposited first because it has been found to have good adhesion to aluminum as well as polyimide. However, since gold does not adhere well to TiWN layer 16, TiW layer 17 is deposited on top of layer 16. Titanium-tungsten has been found to adhere well to both Titanium-tungsten-nitride and gold. Finally, gold layer 18 is deposited and a gold bump 19 is formed.

Following these steps, it is necessary to remove the excess adhesion/barrier layer 15. First, the excess gold layer 18 is removed. This leaves device 10 as illustrated in FIG. 2. Next, layers 16 and 17 must be removed. Typically, this is preformed in a wet etch environment as opposed to a dry etch. The reason for using wet etching is that gold tends to resputter when subjected to dry etching. This resputtering reduces the size of bump 19; weakens bump 19; and causes a layer of gold to be distributed back on the surface of layers 16 and 17.

To avoid the above problems, wet etching is used. However, wet etching also has some disadvantages such as under cutting bump 19 during etching. A major cause of the under cutting is a galvanic effect which takes place at the interface of two chemically different metals. Here the different metals are gold and titanium-tungsten. This action is enhanced in etching if the etchant is electrically conductive (e.g. an electrolyte).

Figure 4:
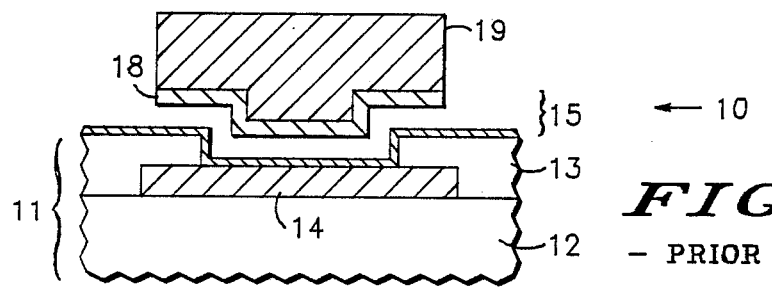
FIG. 4 is a process flow diagram illustrating one step in the prior art method.

Typically, TiW is etched with a solution comprising EDTA (ethylenediaminetraacetic acid), hyudrogen peroxide ($H_2O_2$) and ammonium hydroxide ($NH_4OH$), of which ammonium hydroxide is an electrolyte, at room temperature. This electrolyte causes the etching of layer 17 to be accelerated between layers 17 and 18. Further, TiWN layer 16 does not etch as fast as TiW layer 17. This results in device 10 as shown in FIG. 4. Due to the combination of increased etching along the interface of the gold/titanium-tungsten layers and the slower rate of etching of TiWN are compared to TiW, the entire layer of TiW will be removed from beneath bump 19 before layer 16 is finished etching.

To resolve this problem, the ammonium hydroxide elecrolyte is eliminated and a 30% solution of hydrogen peroxide ($H_2O_2$) alone is used. Since hydrogen peroxide is a neutral chemical it does not serve to accelerate the galvanic effect. This causes a relative slowing of the etching of layer 17 beneath gold layer 18.

However, TiW layer 17 still etches faster than TiWN layer 16 allowing some under cutting to remain. To eliminate this the temperature of the reaction is raised from room temperature to approximately 80°–90° C. This has little effect on the etch rate of TiW and increases the etch rate of the TiWN. Following this step, device 10 is as shown in FIG. 3. As shown, excess layers 16 and 17 have been removed without totally undercutting bump 19.

In addition to the above, it has been found that the under cutting has a tendency to stop at a via 20. This is believed to be due to the lack of bubble formation during EDTA etching as opposed to hydrogen peroxide etching. The bubbles tend to keep the etching solution from the surface and thereby slow the etching under bump 19.

Thus, it will be apparent to one skilled in the art after reviewing the above, that there has been provided in accordance with the invention, a method that fully satisfies the objects, aims and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. A method of chemically etching a semiconductor device comprising:
   providing a semiconductor device having a substrate, a layer of titanium-tungsten-nitride coupled to said substrate, a layer of titanium-tungsten coupled to said layer of titanium-tungsten-nitride, and a metal contact coupled to a first portion of said titanium-tungsten layer; and
   etching said titanium-tungsten and titanium-tungsten-nitride layers in a 30% solution of hydrogen peroxide at a temperature between approximately 80°–90° C. to remove a second portion of said titanium-tungsten layer and a portion of said titanium-tungsten-nitride layer adjacent said second portion of said titanium tungsten layer.

2. The method of claim 1 further comprising providing a layer of gold disposed between said layer of titanium-tungsten and said metal contact.

3. The method of claim 1 wherein said metal contact is gold.

4. A method of chemically etching a semiconductor device comprising:
   providing a semiconductor device having a substrate, a layer of titanium-tungsten-nitride coupled to said substrate, a layer of titanium-tungsten coupled to said layer of titanium-tungsten-nitride, a layer of gold coupled to said layer of titanium-tungsten, and a metal contact coupled to a first portion of said gold layer;
   etching said layer of gold to remove a portion not coupled to said metal contact; and
   etching said titanium-tungsten and titaium-tungsten-nitride layers in a 30% solution of hydrogen peroxide at approximately 80°–90° C.

5. The method claim 4 wherein said metal contact is gold.

* * * * *